United States Patent

[11] 3,601,628

[72] Inventors Donald J. Redwine;
Earl M. Worstell, Jr., both of Houston, Tex.
[21] Appl. No. 836,510
[22] Filed June 25, 1969
[45] Patented Aug. 24, 1971
[73] Assignee Texas Instruments Incorporated
Dallas, Tex.

[54] PRECHARGE MOS-BIPOLAR OUTPUT BUFFER
6 Claims, 3 Drawing Figs.

[52] U.S. Cl. .......... 307/205, 307/303, 307/304, 330/18, 330/32, 330/35, 330/38 M
[51] Int. Cl. .......... H03k 19/08
[50] Field of Search .......... 307/205, 213, 251, 303, 304; 330/18, 35, 32, 38, 38 M

[56] References Cited

UNITED STATES PATENTS 3,393,325 7/1968 Borror et al. .......... 307/205
3,466,511 9/1969 Lin .......... 307/303 X

OTHER REFERENCES

Ahrons et al, " Hybrid Bi-Polar and Mos Digital Circuits" RCA Technical Notes RCA TN No. 684, June 1966 307-304

*Primary Examiner*—Roy Lake
*Assistant Examiner*—James B. Mullins
*Attorneys*—James O. Dixon, Andrew M. Hassell, Harold Levine, Melvin Sharp, John E. Vandigriff, Henry T. Olsen and Michael A. Sileo, Jr.

ABSTRACT: A two-phase, precharge MOS-bipolar output buffer for an integrated semiconductor circuit which utilizes a bipolar transistor and an MOS transistor formed on the same semiconductor chip and connected in push-pull configuration at the output. The bipolar transistor is turned "off" and the MOS transistor turned "on" regardless of the level of the logic input during a first pulsed clock to precharge the capacitive load to a logic "1," then the bipolar transistor is kept "off" to maintain the logic "1" if the logic input is a logic "0" or is turned "on" to discharge the capacitive load if the input is a logic "1." The output buffer can drive capacitive loads at high speed because the output MOS transistor can be made as large as necessary to charge the load rapidly without increasing the input capacitance and the gain of the bipolar device provides the necessary current to discharge the load rapidly.

INVENTORS
DONALD J. REDWINE
EARL M. WORSTELL, JR.

INVENTORS
DONALD J. REDWINE
EARL M. WORSTELL, JR.

PRECHARGE MOS-BIPOLAR OUTPUT BUFFER

The invention relates generally to metal-insulator-semiconductor integrated circuits, and more particularly relates to an improved precharge output buffer for an integrated logic circuit.

The metal-insulator-semiconductor (MOS) transistor wherein the insulator is silicon oxide is currently the most practical form and therefore the most widely used type of field effect transistor. Such an MOS transistor is typically a high voltage, low current device. These characteristics are due mainly to the values of hole and electron mobilities at the surface of the semiconductor. These characteristics require that the MOS transistors drive high impedance loads in order to develop the voltage levels required in a circuit. These devices have many useful applications in integrated circuit form, commonly referred to as MOSIC's. In a typical system, one MOSIC will drive one or more other MOSIC's. Thus, the output load, for all practical purposes, is the capacitance of the input MOS transistors on the other MOSIC's. In general, the problem of rapidly transferring the logic signal from one MOSIC to another MOSIC has been the most difficult to overcome in the design of such devices. Internally an MOSIC may be very complex and fast, but this characteristic has heretofore been practically useless because the speed of the circuit was limited by the slowness of the output buffers.

The output impedance, and therefore the transient time performance, of an all MOS output buffer is controlled by adjusting the width-to-length ratio of the MOS transistors. Conventional output buffers use very large MOS transistors to drive even minimal external capacitances, such as 20 picofarads, at relatively slow speeds, such as 1 MHz. The large output MOS transistors must themselves be driven by large MOS transistors, such that each of the last few stages of a circuit must have progressively larger drive capability. This results in what is commonly referred to as a tapered output. The larger MOS transistors have increased power dissipation and occupy a large area of the integrated circuit chip.

Many MOSIC's employ a two-phase clock system in which the pulses of the clocks are mutually exclusive. This type of MOSIC typically utilizes an all MOS precharge output buffer. However, such buffers have moderate input capacitances, typically on the order of 0.42 picofarads, thus requiring some tapering. These buffers have a high output impedance and the consequent low drive capability, and generate noise under heavy loading.

This invention is concerned with an improved precharge output buffer for an MOSIC having at least two mutually exclusive clock pulses. The output buffer in accordance with the present invention has a very low output impedance and is thus capable of driving larger capacitive loads when compared with the conventional all MOS precharge buffer, has an input capacitance on the order of 0.072 picofarads which eliminates the need for tapering, has low power dissipation because there are no DC paths to ground, and requires only one power supply in addition to the pulsed clock voltage.

The output buffer in accordance with the present invention utilizes an output stage comprised of a bipolar transistor and an MOS transistor connected in push-pull configuration. MOS circuit means is provided for simultaneously turning the output MOS transistor "on" and turning the bipolar transistor "off" during the pulses of the first clock regardless of the state of the logic input to precharge the capacitive load to a logic "1" condition. After each pulse of the clock, the bipolar transistor remains "off" if the input is a logic "0" and the output remains a logic "1," or the bipolar transistor is turned "on" if the input is a logic "1" to discharge the output to a logic "0." The period of the second clock pulse may be used to sample the logic output during the "off" cycles of the first clock.

The novel features believed characteristic of this invention are set forth in the appended claims. The invention itself, however, as well as other objects and advantages thereof, may best be understood by reference to the following detailed description of an illustrative embodiment, when read in conjunction with the accompanying drawings, wherein:

Figure 1:
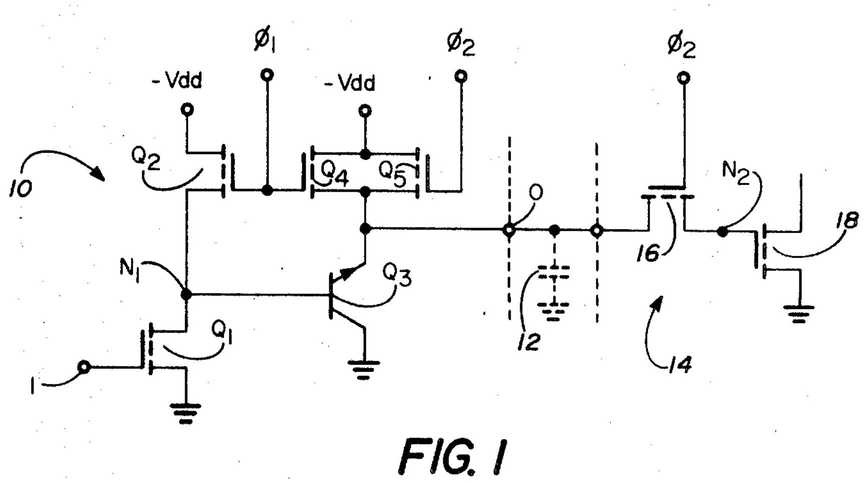
FIG. 1 is a schematic circuit diagram of an output buffer in accordance with the present invention.
Figure 3:
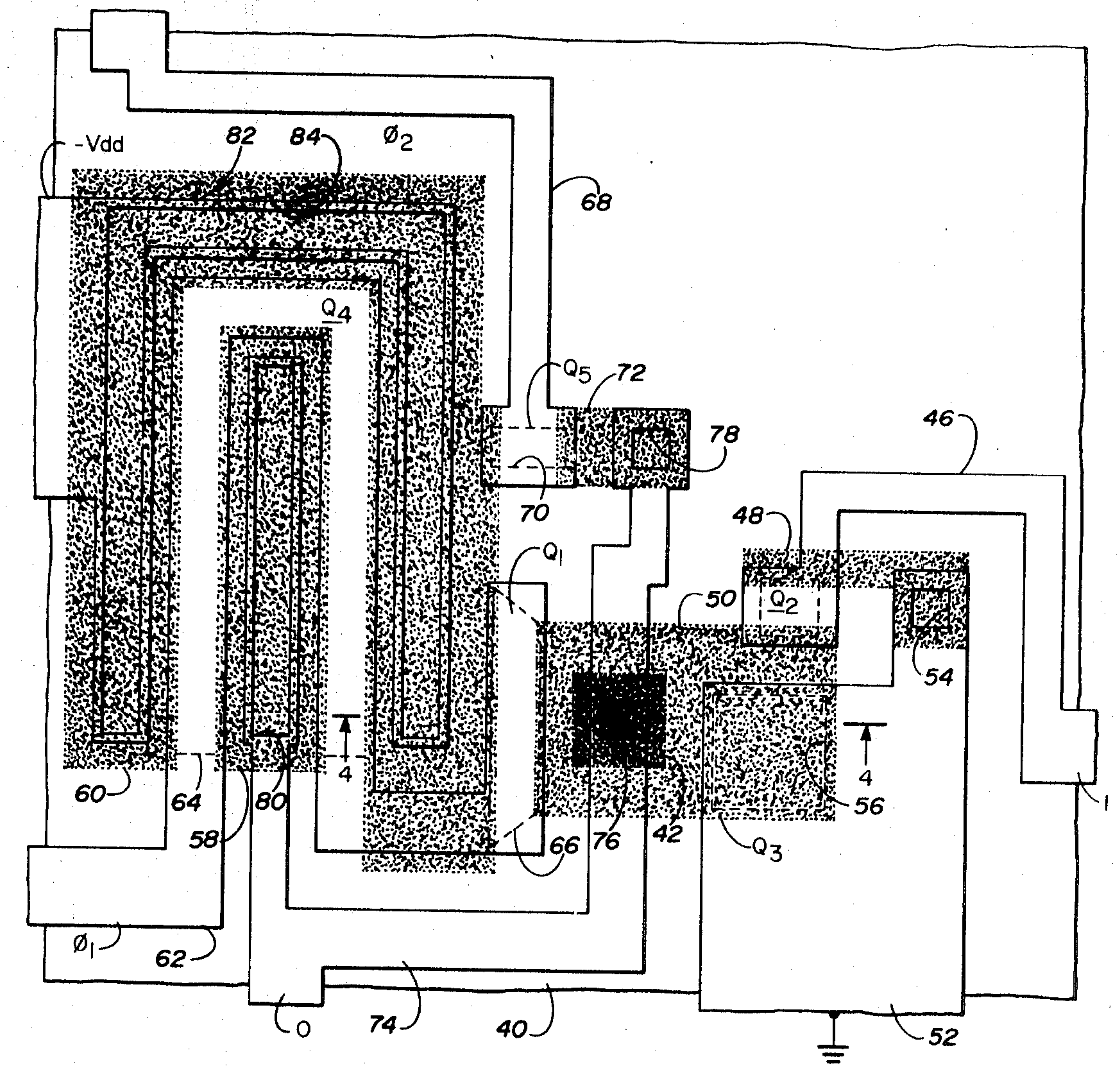
Figure 4:
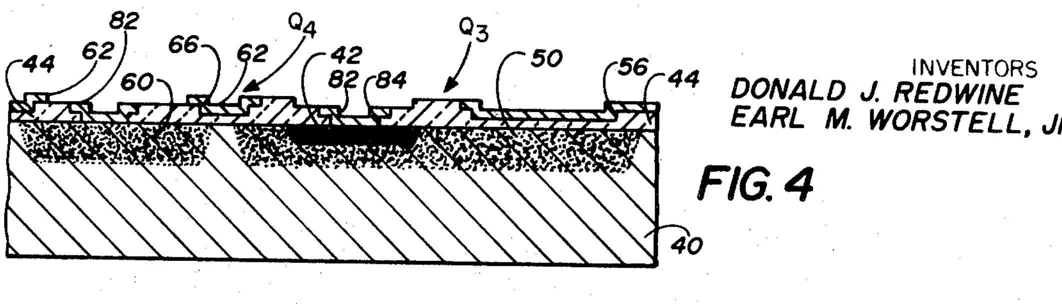

FIG. 3 is a partial plan view of an integrated circuit illustrating the output buffer of FIG. 1; and FIG. 4 is a sectional view taken substantially on lines 4—4 of FIG. 3. Referring now to the drawings, an output buffer in accordance with the present invention is indicated generally by the reference numeral 10 in FIG. 1. The output buffer 10 has an input stage comprised of MOS transistors $Q_1$ and $Q_2$ the channels of which are connected in series between source and drain supply voltages. The embodiment selected for illustrative purposes utilizes P-channel MOS devices and accordingly the source voltage is ground and the drain voltage is typically −6.0 volts. The gate of MOS transistor $Q_1$ is the logic input I to the buffer. The drain of transistor $Q_1$ and the source of transistor $Q_2$ are common and form node $N_1$, which is also common with the base of a bipolar transistor $Q_3$.

Bipolar transistor $Q_3$ forms part of a push-pull output stage which includes MOS transistors $Q_4$ and $Q_5$. The collector of the bipolar transistor $Q_3$ is connected to ground and the emitter is common with the source of MOS transistors $Q_4$ and $Q_5$ and forms the output O of the buffer.

The gates of MOS transistors $Q_2$ and $Q_4$ are connected to a first clock voltage $\Phi_1$, and the gate of MOS transistor $Q_5$ is connected to a second clock voltage $\Phi_2$. The output buffer will typically drive a second MOSIC indicated generally by the reference numeral 14, which has an input capacitance represented by the capacitor 12. The logic signal at output O will typically be applied through an MOS transistor 16 which is turned "on" by clock $\Phi_2$, to apply and then store the logic output voltage on the gate, which is referenced as node $N_2$, of an MOS transistor 18, which is the input of MOSIC 14.

The width-to-length ratio of MOS transistor $Q_2$ is substantially larger than that of the input MOS transistor $Q_1$. For example, the width-to-length ratio of MOS transistor $Q_2$ may be 9, while that of input MOS transistor $Q_1$ may be 3. As a result, the voltage at node $N_1$ is sufficiently negative to insure that bipolar transistor $Q_3$ is "off" whenever clock $\Phi_1$ turns MOS transistor $Q_2$ "on," regardless of the logic level of input I. Bipolar transistor $Q_3$ typically has a $h_{fe} \approx 50$, transistor $Q_4$ typically has a width-to-length ratio of 55, and MOS transistor $Q_5$ typically has a width-to-length ratio of 1.

Figure 2:
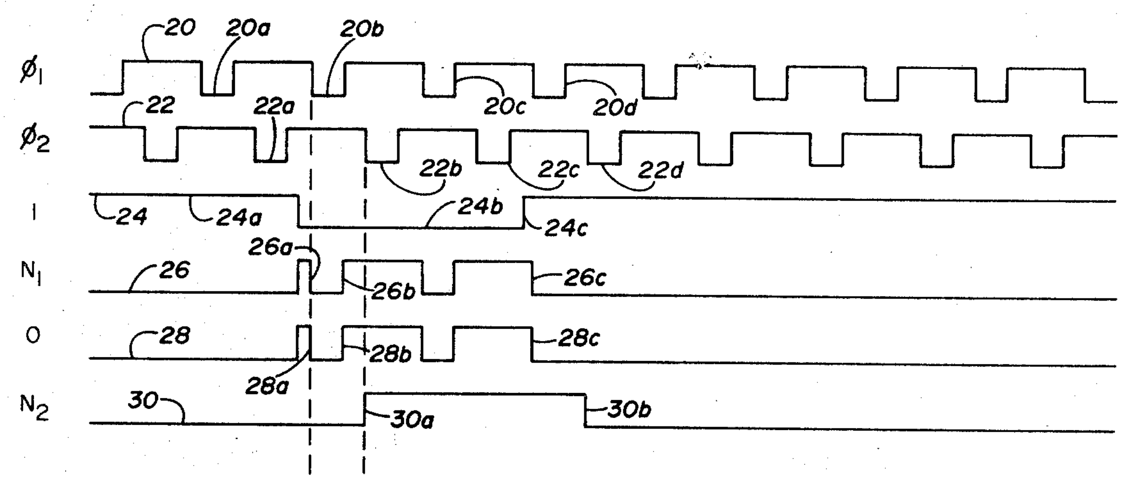
FIG. 2 is a timing diagram which serves to illustrate the operation of the circuit of FIG. 1.

The operation of the output buffer 10 can best be understood by referring to the timing diagram of FIG. 2. The voltage of clock $\Phi_1$ with respect to time is represented by line 20. MOS transistors $Q_2$ and $Q_4$ are turned "on" by negative going pulses 20*a*, 20*a*, etc. The voltage of clock $\Phi_2$ is represented by line 22, and MOS transistors $Q_5$ and $Q_{16}$ are turned "on" by negative going pulses 22*a*, 22*b*, etc. The voltage at the input I is represented by line 24, with segment 24*a* representing a logic "0" level, typically near ground potential, and segment 24*b* representing the logic "1" level of approximately −6.0 volts. The voltage at node $N_1$ is represented by line 26, the voltage at output O is represented by line 28, and the voltage at node $N_2$ is represented by line 30. In each case, the upper voltage level is near ground potential, and the lower voltage level is nominally −6.0 volts.

Assume now that the input I is at a logic "0" level as indicated by segment 24*a* of line 24, and that node $N_2$ is at a logic "1" level as indicated by line 30. When clock pulse 20*a* occurs, transistors $Q_2$ and $Q_4$ will be turned "on." Node $N_1$ will then approach the drain voltage $-V_{dd}$, as indicated by line 26, and bipolar transistor $Q_3$ will be turned "off." The output O will also approach the drain voltage $-V_{dd}$, as indicated by line 28, as a result of transistor $Q_4$ being turned "on." During pulse 22*a* of clock $\Phi_2$, node $N_1$ and the output O will remain at the logic "1" level, because the logic "0" level at input I has transistor $Q_1$ turned "off," thus holding the charge at node $N_1$ and keeping bipolar transistor $Q_3$ turned "off." During pulse 22*a* of clock $\Phi_2$, sampling MOS transistor 16 is turned "on" so that any leakage of the negative charge on node $N_2$ will be restored. At the same time, transistor $Q_5$ is turned "on" so as to assist in maintaining the logic "1" level during the pulse of clock $\Phi_2$.

Assume that the input then goes to a logic "1" level at some point between pulse 22*a* of clock $\Phi_2$and the next pulse 20*b* of clock $\Phi_1$. Node $N_1$ is then discharged to ground through input transistor $Q_1$ , thus turning transistor $Q_3$ "on" and discharging the output O to ground. It will be noted, however, that node $N_2$ remains at the logic "1" level because sampling transistor 16 is "off" and holds the charge on node $N_2$. When pulse 20*b* of clock $\Phi_1$ again turns transistors $Q_2$ and $Q_4$ "on," transistor $Q_2$ dominates transistor $Q_1$ and node $N_1$ again goes negative at 26*a*, even though transistor $Q_1$ is turned "on" by the logic "1" level at input I. As a result, transistor $Q_3$ is turned "off" and the output again goes negative at 28*a*. However, as soon as clock pulse 20*b* terminates, transistor $Q_1$ discharges node $N_1$, as represented at 26*b*, thus turning transistor $Q_3$ "on" and discharging the output O as represented at 28*b*. However, the logic "0" level is not transferred to node $N_2$ until sample pulse 22*b* of clock $\Phi_2$ turns transistor 16 "on" so that the charge on node $N_2$ can be discharged by transistor $Q_3$ at 30*a*. Transistor $Q_5$ is so small that it is dominated by bipolar transistor $Q_3$. Thus, it will be noted from the above discussion that the logic level is inverted and then transferred from the input I to the node $N_2$ after one-half cycle delay. These conditions will continue so long as the input I is at the logic "1" level.

When the input I returns to the logic "O" level at 24*c*, node $N_1$ and the output O will go to the logic "1" level at 26*c* and 28*c*, respectively, with pulse 20*d* of clock $\Phi_1$. Then on the next sample pulse 22*d* of clock $\Phi_2$, the logic "1" level will be transferred to node $N_2$ as represented at 30*b*. Thus, the transfer of the logic level is again delayed by one-half cycle. The delays create no significant problem in a two-phase system.

The circuit of FIG. 1 is shown in the partial plan view of FIG. 3 and the sectional view of FIG. 4 wherein corresponding circuit components are designated by corresponding reference characters. The substrate 40 is typically N-type silicon. P-type diffused regions form the source and drain regions of the various MOS transistors and are represented by the lightly stippled areas, and an N-type diffused region is made into one of the P-type diffused regions to form the emitter of the bipolar transistor $Q_3$. The N-type diffusion is represented by the heavily stippled area 42. A layer of insulation 44, typically silicon oxide, although other insulators such as silicon nitride may be used, is formed over the surface of the substrate. Metal conductor strips illustrated in solid outline are then formed over the oxide 44 which is made thin under the metal strips in areas where the channel of an MOS transistor is to be formed and is opened completely where contact with an underlying diffusion is required.

Thus, the conductor 46 in FIG. 3 forms the input I and the gate of input MOS transistor $Q_2$. P-type diffusions 48 and 50 form the source and drain regions, respectively, of MOS transistor $Q_2$. Diffusion 50 also forms the base of the bipolar transistor $Q_3$ and the N-type diffusion 42 forms the emitter. The substrate 40 forms the collector of bipolar transistor $Q_3$. Metal conductor 52 is the ground lead and is connected to source diffusion 48 through an opening 54 in the oxide 44. The oxide layer 44 is also made thin in a an area 56 to form a capacitor between the base of the bipolar transistor $Q_3$ and ground to assist in storing the voltage at node $N_1$. P-type diffusions 58 and 60 form the source and drain regions, respectively, of transistor $Q_4$. Conductor 62 is connected to the clock voltage $\Phi_1$ and forms the gate of transistor $Q_4$ in the area 64 where the oxide layer 44 is thin, and forms the gate for transistor $Q_1$ in the area 66 where the oxide layer is thin. Diffused region 60 also serves as the drain region for transistor $Q_1$ and for the drain region of transistor $Q_5$. Conductor 68 is connected to the clock voltage $\Phi_2$ and forms the gate of transistor $Q_5$ in the area 70 where the oxide is thin. Diffused region 72 forms the source of transistor $Q_5$. Metal conductor 74 forms the output O and is connected to the diffused emitter region 42 of bipolar transistor $Q_3$ the diffused source region 72 of MOS transistor $Q_5$, and the diffused source region 58 of MOS transistor $Q_4$ through openings 76, 78 and 80, respectively, in the oxide layer 44. Conductor 82 is connected to the drain supply voltage $-V_{dd}$ and is in contact with diffused region 60 through opening 84 in the oxide layer 44.

Although the embodiment of the invention selected for illustration utilizes P-channel MOS transistors and an NPN bipolar transistor, it is to be understood that the invention is equally applicable to N-channel MOS transistors in combination with a PNP bipolar transistor. The invention is also useful in circuits utilizing other forms of field effect devices. The buffer has a very low input capacitance, thus eliminating the need for tapering, has a very low output impedance, thus giving it a high drive capability, has low power requirements because there are no DC paths to ground, and has relatively few components which occupy a relatively small area of an integrated circuit chip.

Although a preferred embodiment of the invention has been described in detail, it is to be understood that various changes, substitutions and alterations can be made therein without departing from the spirit and scope of the invention as defined by the appended claims.

What we claim is:

1. The output buffer for an integrated semiconductor circuit comprising a bipolar transistor and an output field effect transistor connected in push-pull configuration with the emitter of said bipolar transistor being connected to the source of said field effect transistor, first circuit means for turning the bipolar transistor "off" during the pulses of a first clock voltage and for turning the output field effect transistor "on" to charge a load capacitance, and second circuit means for turning bipolar transistor "on" only in the absence of the clock pulse and the presence of a predetermined logic input signal.

2. The output buffer defined in claim 1 wherein the first circuit means comprises a second field effect transistor connecting the base of the bipolar transistor to a drain voltage supply, and the second circuit means comprises a third field effect transistor connecting the base of the bipolar transistor to the source voltage supply the gate of the third field effect transistor being the logic input, the saturation impedance of the third field effect transistor being substantially higher than that of the second field effect transistor.

3. The output buffer defined in claim 2 further characterized by a fourth field effect transistor connecting the emitter of the bipolar transistor to the drain supply voltage, the gate of the fourth field effect transistor being connected to a second pulsed clock voltage for turning the fourth field effect transistor "on" during a portion of the period when the first pulsed clock voltage is "off."

4. The integrated circuit comprising a substrate of one conductivity type, a plurality of diffused regions of the other conductivity type, at least one diffused region of said one conductivity type formed in one of the diffused regions of the other conductivity type to form a bipolar transistor, means forming a plurality of field effect channels between selected diffused regions of the other conductivity type to form field effect transistors, and means forming an output buffer circuit comprising the bipolar transistor and a selected one of the field effect transistors connected in push-pull configuration, said one diffused region being connected to the diffused source region of the selected field effect transistor, first circuit means for turning the bipolar transistor "off" during the pulses of a first clock voltage and for turning said selected field effect transistor "on" to charge a load capacitance, and second circuit means for turning the bipolar transistor "on" only in the absence of the clock pulse and the presence of a predetermined logic input signal.

5. A precharge output buffer for an integrated semiconductor circuit comprising first and second MOS transistors connected in series between source ad drain voltage sources, the first MOS transistor having a substantially lower saturation impedance than the second MOS transistor, the gate of the second MOS transistor being the logic input, a third MOS transistor and a bipolar transistor connected in series between the source and drain voltage with the emitter of the bipolar transistor and the source of the third MOS transistor common and forming the logic output and with the base of said bipolar transistor connected to the common source-drain junction of said first and second MOS transistors, and a first pulsed clock voltage connected to the gates of the first and third MOS transistors.

6. The precharge output buffer of claim 5 further comprising a fourth MOS transistor connected in parallel with the third MOS transistor, and a second pulsed clock voltage connected to the gate of the fourth MOS transistor for turning the fourth MOS transistor "on" during at least a portion of the period when the first pulsed clock voltage is "off."